(12) United States Patent
Cioaca et al.

(10) Patent No.: US 6,738,298 B1
(45) Date of Patent: May 18, 2004

(54) AUTOMATIC REFERENCE VOLTAGE REGULATION IN A MEMORY DEVICE

(75) Inventors: Dumitru Cioaca, Cupertino, CA (US); Christophe Chevallier, Palo Alto, CA (US); Al Vahidimowlavi, San Jose, CA (US); Frankie Fariborz Roohparvar, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/298,830

(22) Filed: Nov. 18, 2002

(51) Int. Cl.$^7$ .............................................. G11C 16/04
(52) U.S. Cl. ........................... 365/189.09; 365/189.05; 365/189.07
(58) Field of Search ................... 365/189.09, 189.05, 365/189.07, 225.7, 236, 233

(56) References Cited

U.S. PATENT DOCUMENTS

| | | |
|---|---|---|
| 6,147,908 A | 11/2000 | Abugharbieh |
| 6,449,197 B1 * | 9/2002 | Hiraki et al. .......... 365/189.05 |
| 6,459,649 B2 | 10/2002 | Krause |
| 6,496,436 B2 | 12/2002 | Naji |

* cited by examiner

Primary Examiner—David Lam
(74) Attorney, Agent, or Firm—Leffert Jay & Polglaze, P.A.; Kenneth W. Bolvin

(57) ABSTRACT

A transition of an external enable signal generates a reset pulse to a counter to set the counter into a known state. The counter, clocked by the external clock signal, generates a clock signal that is decoded by a fuse decoder circuit. The fuse decoder circuit outputs a selection signal to a trim circuit. The trim circuit produces a voltage selection signal, such as a resistance value, that is indicated by the selection signal for use by an internal reference voltage generation circuit. The output of the internal reference voltage generation circuit is compared to the external reference voltage. The counter circuit continues counting until the internal reference voltage is equal to or greater than the external reference voltage. The counter is disabled and the final count that produced the proper internal reference voltage is stored in non-volatile memory cells for future use.

25 Claims, 8 Drawing Sheets

AUTOMATIC REFERENCE VOLTAGE REGULATION IN A MEMORY DEVICE

BACKGROUND OF THE INVENTION

I. Field of the Invention

The present invention relates generally to reference voltage adjustments and particularly to adjustment of a reference voltage in a memory device.

II. Description of the Related Art

Memory devices are typically provided as internal storage areas in computers. The term memory identifies data storage that comes in the form of integrated circuit chips. There are currently many different types of memory.

One type is random access memory (RAM). This is typically used as the main memory in a computer system. RAM refers to memory that can be both written to and read from. This is in contrast to read only memory (ROM) that permits data to only be read. Most RAM is volatile meaning that it requires a steady flow of power to maintain its contents. When power is turned removed, the data in RAM is lost.

An electrically erasable programmable read-only memory (EEPROM) is a special type of non-volatile ROM that can be erased a byte at a time by exposing it to an electrical charge. EEPROMs comprise a large number of memory cells having electrically isolated gates (floating gates). Data is stored in the memory cells in the form of a charge on the floating gates. The charge is transported to or removed from the floating gates by programming and erase operations, respectively.

A flash memory is a type of EEPROM that can be erased and reprogrammed in blocks instead of one byte at a time. A typical flash memory device comprises a memory array that includes a large number of memory cells arranged in row and column fashion. Each of the memory cells includes a floating gate field-effect transistor capable of holding a charge. The cells are usually grouped into blocks. Each of the cells within a block can be randomly programmed by charging the floating gate. The charge can be removed from the floating gate by a block erase operation. The data in a cell is determined by the presence or absence of the charge in the floating gate.

Some EEPROM and flash memory devices require an internal reference voltage that is used to determine when certain cells are programmed. Each cell is coupled through a bit line (also known as a column) to a sense amplifier. When the particular cell is accessed through the row and column signals, that cell is coupled to one input of the sense amplifier. The other input of the sense amplifier is connected to the reference voltage ($V_{ref}$). The difference between the two voltages determines if the cell has been programmed. $V_{ref}$, therefore; must be an accurate voltage since the difference may come down to tenths of volts.

A memory device etched into a die may have slightly different properties than the same circuit etched into second die. $V_{ref}$ on each of these two dies may differ by a couple tenths of volts. In order to maintain consistent results and high quality, these voltages need to be made consistent.

One way that has been used to adjust $V_{ref}$ is with a trim adjustment circuit. A typical prior art trim adjustment circuit 100 is illustrated in FIG. 1. This circuit 100 is included on the die with the memory circuitry.

The trim adjustment circuit 100 is connected to an external test device through the integrated circuit's data bus 101. The test device transmits data over the bus 101 to instruct the circuit 100 to change the resistance of the trim circuit 122 in order to change the reference voltage generated by the $V_{ref}$ voltage circuit 125.

The test device sends four bits of data over the bus 101 that is converted to complementary data prior to being input to the circuit 100. This data and their complementary signals are shown as FL0, FL0*, FL1, FL1*, FL2, FL2*, FL3, and FL3*. The data is input through fuse latches 103–106 to a fuse decoder 120. The fuse decoder 120 decodes the data to correspond to one of sixteen decode lines (i.e., d0–d15) connecting the decoder 120 to the trim circuit 122.

The decode lines select one of sixteen possible resistor combinations in the trim circuit 122 that is connected to the reference voltage circuit 125. The output voltage from the reference voltage circuit 125 is connected to the external test device in order to measure the $V_{ref}$ that is generated with a particular combination of resistors in the trim circuit 122.

One problem with the prior art device of FIG. 1 is that the test device has to load a data value, measure the generated reference voltage, and determine if that voltage is correct. This may have to be repeated for all sixteen possible data combinations (i.e., 0000–1111) in order to find the proper combination of resistors to generate the desired $V_{ref}$. These steps have to be repeated for each individual die in a serial fashion in order to achieve maximum $V_{ref}$ accuracy. Such time consuming procedures cost the integrated circuit manufacturer valuable production time. There is a resulting need in the art for a quicker way to adjust an integrated circuit's reference voltage.

SUMMARY

The present invention encompasses a reference voltage adjustment circuit comprising a counter circuit that generates a count signal. A decoder circuit is coupled to the counter circuit. The decoder circuit decodes the count signal to generate a resistance selection signal. The resistance selection signal is input to a resistor network that generates a resistance value in response to the resistance selection signal. The resistance value is coupled to a reference voltage circuit that generates an updated reference voltage in response to the resistance value.

In one embodiment, the updated reference voltage is compared to a reference voltage provided from an external source. If the two voltages are substantially equal, the counter circuit is disabled.

DETAILED DESCRIPTION

The embodiments of the automatic trim circuit of the present invention provide a way to automatically adjust a reference voltage, $V_{ref}$. Only an external reference voltage and a clock are required to cause a counter to step through each trim circuit resistor combination until the proper $V_{ref}$ is measured with an internal comparator and the counter stopped.

Figure 1:
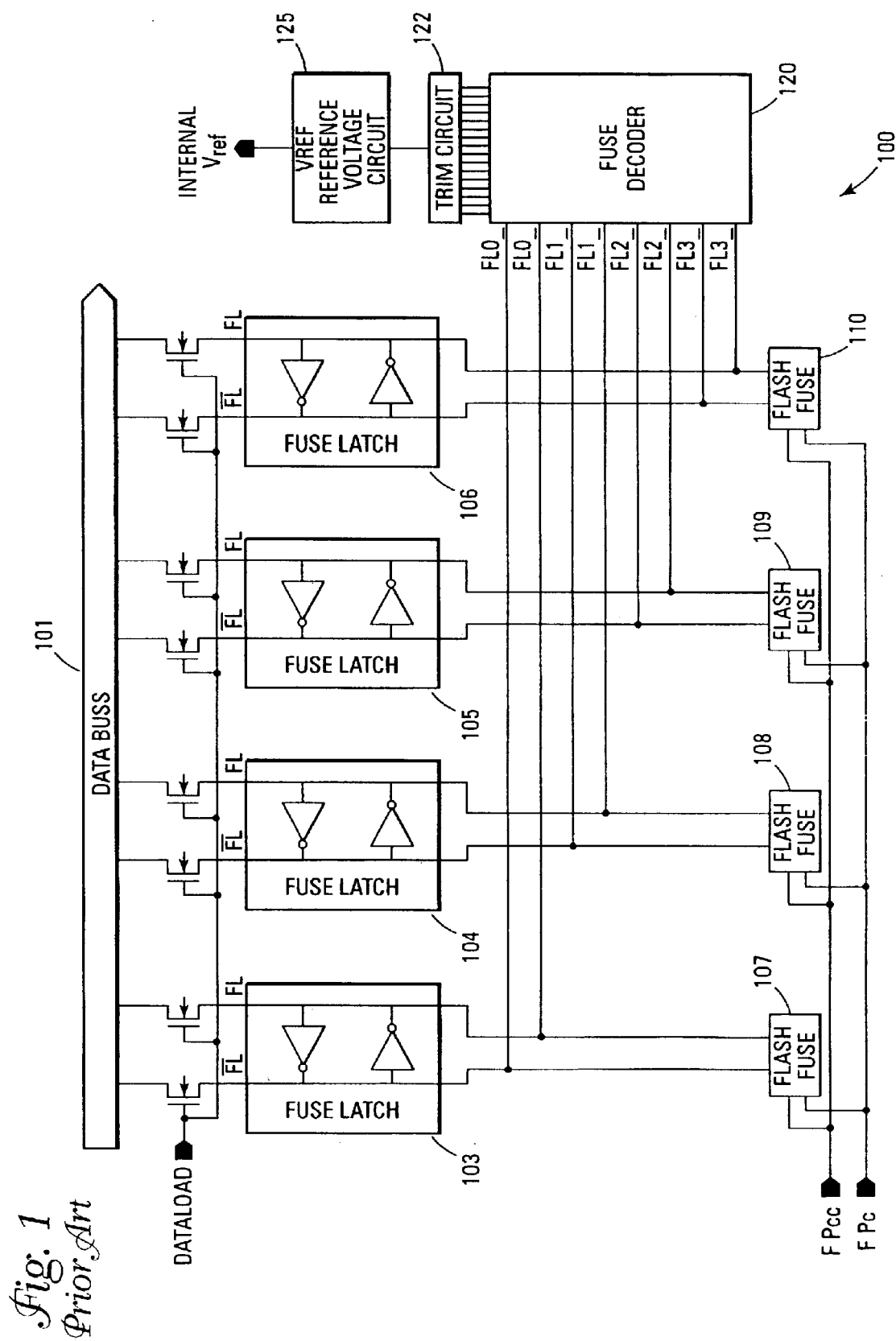
FIG. 1 shows a schematic diagram of a typical prior art $V_{ref}$ adjustment circuit.
Figure 2:
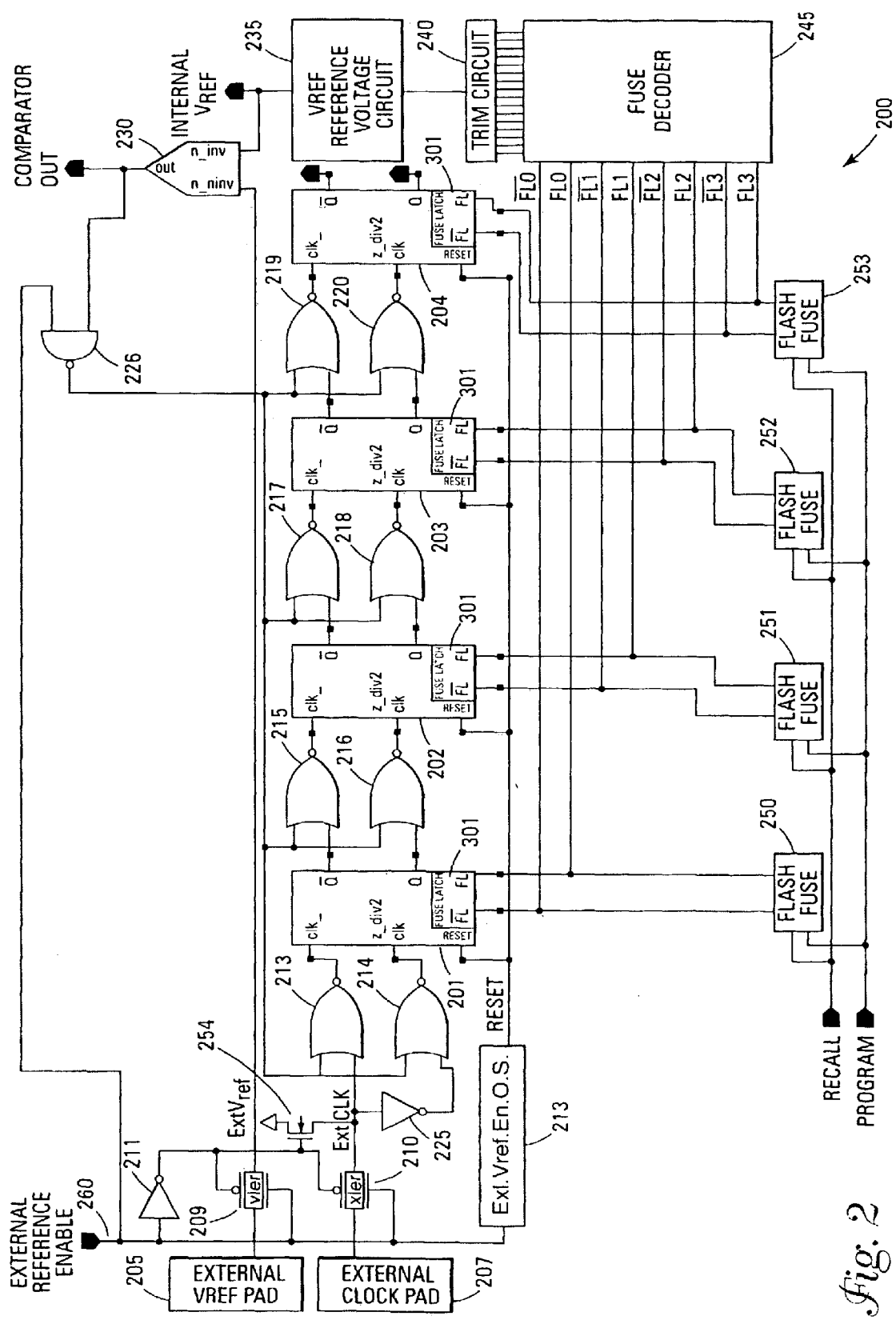
FIG. 2 shows a diagram of one embodiment of a reference voltage circuit with automatic trim adjustment of the present invention.

FIG. 2 illustrates a logic diagram of one embodiment of a reference voltage circuit with automatic trim adjustment 200 of the present invention. The circuit 200 uses four divide-by-2 fuse latch circuits 201–204 that, together, act as a four-bit counter circuit. Each divide-by-2 fuse latch circuit 201–204, incorporates a master/slave flip-flop as well as a fuse latch circuit. The divide-by-2 fuse latch circuit of the present invention is described subsequently in greater detail with reference to FIG. 3.

The divide-by-2 fuse latch circuits 201–204 are clocked by an external clock signal source that is provided through a clock pad 207 or some other type of external connection. The clock signal clocks the first divide-by-2 fuse latch circuit 201 through two NOR gates 213, 214 that, as discussed later, enable/disable the clock to the counter circuit at the appropriate time. An inverter 225 generates a complementary clock signal, CLK*. Together, CLK and CLK* generate FL0 and FL0*, respectively, from the first divide-by-2 fuse latch circuit 201.

The second divide-by-2 fuse latch circuit 202 is clocked by the Q and Q* signals of the first divide-by-2 fuse latch circuit 20i. These signals are input to two NOR gates 215, 216 that provide the enable/disable function. The second divide-by-2 fuse latch circuit 202 generates the FL1 and FL1* signals.

The third divide-by-2 fuse latch circuit 203 is clocked by the Q and Q* signals from the second divide-by-2 fuse latch circuit 202. These signals are input to two NOR gates 217, 218 that provide the enable/disable function. The third divide-by-2 fuse latch circuit 203 generates the FL2 and FL2* signals.

The fourth divide-by-2 fuse latch circuit 204 is clocked by the Q and Q* signals from the third divide-by-2 fuse latch circuit 203. These signals are input to two NOR gates 219, 220 that provide the enable/disable function. The fourth divide-by-2 fuse latch circuit 204 generates the FL3 and FL3* signals.

The FL0, FL1, FL2, FL3 signals and their complements (i.e., FL0*, FL1*, FL2, FL3*) are input to a fuse decoder circuit 245. The fuse decoder circuit 245 performs a decode operation on these signals to generate a signal on one of sixteen outputs (d0–d15) to the trim circuit 240. In one embodiment of the operation of the fuse decoder 245, if the FL inputs are 0001, the fuse decoder 245 generates a logical high signal on the "d1" output. Similarly, if the FL inputs are 0010, the fuse decoder 245 generates a logical high signal on the "d2" output. The operation of the fuse decoder circuit 245 is described subsequently in greater detail with reference to FIG. 4.

The trim circuit 240 accepts the d0–d15 outputs of the fuse decoder 245 and generates different resistance values depending on the logic levels of d0–d15. The operation of the trim circuit 240 is described subsequently in greater detail with reference to FIG. 5.

The different resistance values from the trim circuit 240 are coupled to the $V_{ref}$ reference voltage circuit 235. The resistance values from the trim circuit 240 are used by the reference voltage circuit 235 to generate $V_{ref}$. Therefore, as the resistance values change, the voltage levels generated by the reference voltage circuit 235 also change. The output of the reference voltage circuit 235 is used by the various circuits of the integrated circuit as the internal $V_{ref}$. The output of the reference voltage circuit 235 is also input to a voltage comparator 230.

The voltage comparator 230 compares $V_{ref}$ from the reference voltage circuit 235 with an external $V_{ref}$ voltage provided to the circuit through an external $V_{ref}$ pad 205 or other such connection. When the circuit is enabled, (External Reference Enable="high") and Internal $V_{ref}$ is lower than External $V_{ref}$, the output of the comparator 230 is a logical high state and provided as input in a logical low state through NAND 226 to the NOR gates 213–220. The logical low level from the NAND gate 226 enables the clocking signal to the divide-by-2 fuse latch circuits 201–204.

When the two input voltages are substantially equal or Internal $V_{ref}$ is higher than External $V_{ref}$, the output of the comparator 230 goes to a logical low state. This output is input, through a NAND gate 226, to the NOR gates 213–220 at the clock inputs of the divide-by-2 fuse latch circuits 201–204. The logical high signal from the NAND gate 226 disables the clocking signals to the divide-by-2 fuse latch circuits 201–204.

In operation, the automatic trim adjustment circuit 200 of the present invention is enabled by an external reference enable signal 260. When the external reference enable signal 260 is at a logical low level, the automatic trim adjustment circuit 200 is disabled. When the external reference enable signal 260 is at a logical high level, the circuit 200 is enabled.

The external reference enable signal 260 is input, through an inverter 211, to two transmission gates 209, 210. The external reference enable signal 260 is input to the NAND gate 226. When the signal 260 is low, the output of the NAND gate 226 is high and all the connections between the Q/Q* and clk/clk* between the divide-by-2 fuse latch circuits 201–204 are interrupted by putting the outfits of the NOR gates 213–220 to a low logic level. One transmission gate 209 allows the external $V_{ref}$ signal to pass when it is enabled. The second transmission gate 210 allows the external clock signal to pass when it is enabled. The output of the inverter 211 is connected to the gate of transistor 254. The drain of 254 is connected to 210 and 225 and the source of 254 is connected to $V_{ss}$.

The external reference enable signal 260 is also input to an external Vref enable output signal generator 213 that generates a reset signal to the divide-by-2 fuse latch circuits 201–204. Since these circuits 201–204 may be in an unknown state initially, they should be reset to 0000. In one embodiment, the generated reset signal is a short logical high pulse that is generated by a one-shot circuit. One example of such a short pulse is a 2 ns pulse. Alternate embodiments use other duration pulses to reset the circuit. Still other embodiments may use a logical high or a logical low signal to reset the circuit.

After the counter circuit has been reset to 0000, the external clock signal causes the counter circuit to count from 0000 to 1111. The FL and FL* outputs of the divide-by-2 fuse latch circuits 201–204 are input to the fuse decoder 245 that then decodes these signals to produce a logical high signal on the appropriate d0–d15 output of the decoder 245. In an alternate embodiment, the fuse decoder 245 generates a logical low signal on one of the d0–d15 outputs. In such an embodiment, the trim circuit 240 must be configured to accept the logical low signal in the same way that the logical high signal is used.

The trim circuit 240 changes the resistance value available to the reference voltage circuit 235 in response to the d0–d15 inputs. Therefore, as the counter goes through its range of 0000 to 1111, the internal reference voltages generated by the reference voltage generator change.

These updated internal reference voltages are input to the comparator 230 to be compared to the external $V_{ref}$. The circuit in FIG. 2 will produce, after a reset, an internal $V_{ref}$ that is smaller than the external $V_{ref}$. Under this condition the output of the comparator 230 is high and the output of the NAND gate 226 is low. The NOR gates 213–220 allow the external clock to access the divide-by-2 fuse latch circuits 201–204 to act as a counter. Every new external clock cycle increases the internal $V_{ref}$ level through the new trim created by the new FL0–FL3 combination.

Once the two voltage levels are at least substantially equal, the comparator outputs a high to low signal that is inverted by the NAND gate 226 and input to one of the inputs of each NOR gate 213–220. This shuts off the clock signal to the divide-by-2 fuse latch circuits 201–204 so that the reference voltage circuit 235 generates the appropriate Vref voltage. In one embodiment, the final updated internal reference voltage may slightly exceed the external $V_{ref}$.

The final count values for FL0–FL3, as well as the complementary FL0*–FL3*, that generated the appropriate $V_{ref}$ are latched into the fuse latches of the divide-by-2 fuse latch circuits 201–204. Since these values will disappear once power is removed, they are permanently programmed into flash fuses 250–253 that act as memory to store the final count values. The flash fuses 250–253 in FIG. 2 are for purposes of illustration only. Other types of non-volatile fuses can be used.

The FL0–FL3 values are programmed into the flash fuses 250–253 with a program signal. This process is well known in the art and is not discussed further.

When the integrated circuit that has the automatic trim adjustment circuit 200 of the present invention is powered back-up at a later time, a recall signal is sent to the flash fuses 250–253 to recall the stored data from the flash fuses 250–252 into the fuse latches 301 which are part of divide-by-2 201–204 fuse latch circuits (see FIG. 2 and FIG. 3). The FL0–FL3 values transferred from the flash fuses 250–253 into the fuse latches 301 are the inputs to the fuse decoder 245. After this fuse recall operation, the flash fuses are electrically disconnected from the fuse latches 301. As discussed previously, this sets the appropriate resistance for this particular die, thereby setting an accurate value for the internal $V_{ref}$ signal.

While the embodiment of FIG. 2 shows an external clocking signal being applied to an external clock pad 207, an alternate embodiment uses an internally generated clock signal. For example, a crystal oscillator coupled to a clock signal generation circuit may be used to generate the clock signal for the counter circuit.

Figure 3:
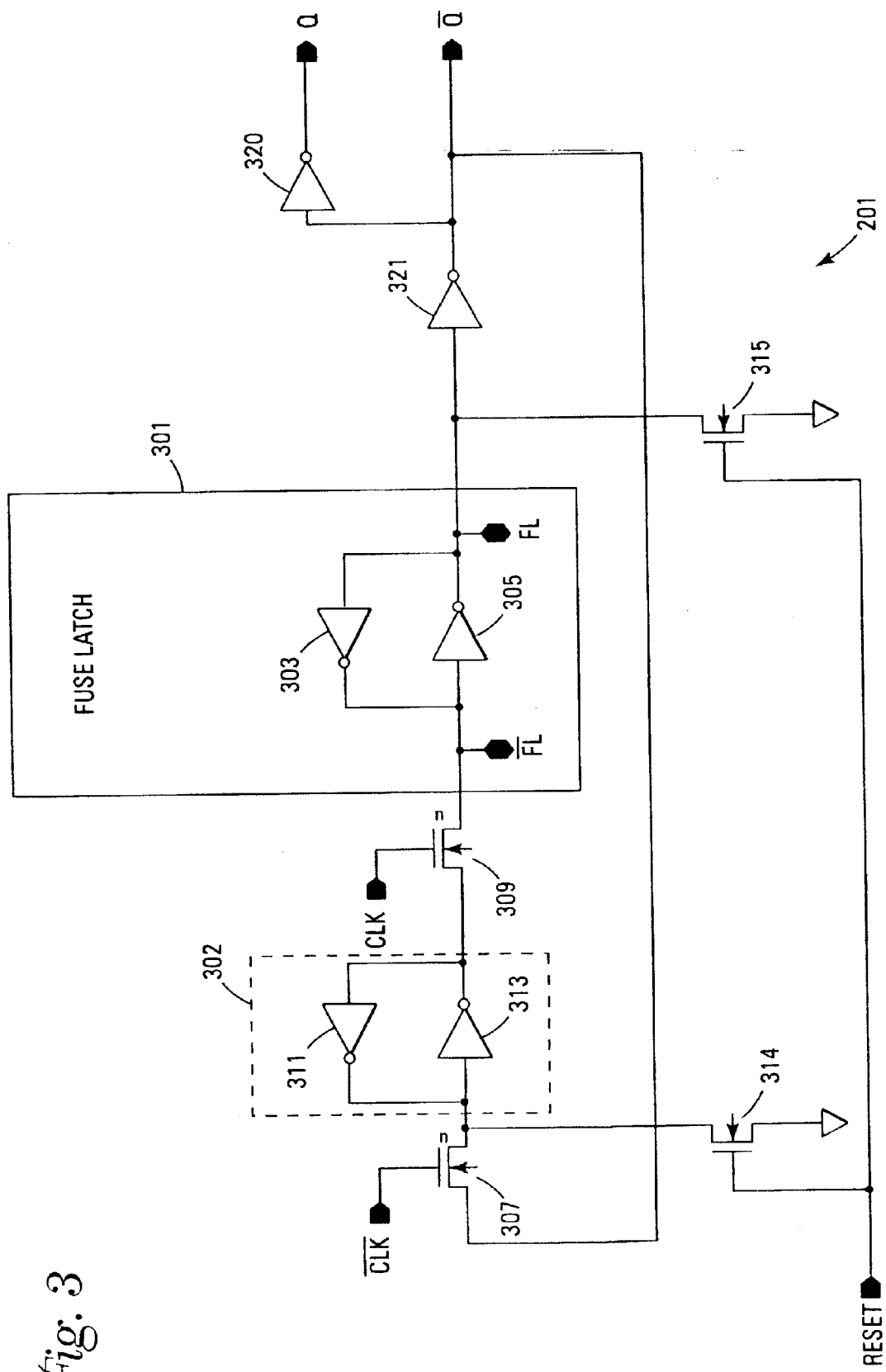
FIG. 3 shows a diagram of a divide by 2, master/slave flip flop and fuse latch circuit in accordance with one embodiment of the present invention.

FIG. 3 illustrates a schematic diagram of a divide-by-2 fuse latch circuit 201 of FIG. 2. Each of the divide-by-2 fuse latch circuits of FIG. 2 is substantially similar to the diagram of FIG. 3.

The reset pulse that is described above resets the circuit 201. The reset pulse turns on two reset transistors 314, 315 that bring the latch portions 301, 302 of the circuit to ground. This zeroes the latches 301, 302 so that FL="low". Since the reset pulse is short, these transistors 314, 315 are only "on" for a short time (e.g., 2 ns) before they are turned off and the circuit is allowed to operate.

After the reset pulse, the CLK and CLK* signals begin to clock two clock transistors 307, 309. As each clock pulse goes high, the respective transistor 307, 309 is turned on which causes the latch circuits 301, 302 to change states. This generates FL and FL* in the fuse latch portion 301 of the circuit 201. The Q and Q* outputs are generated through inverters 320, 321 off the FL signal of the fuse latch 301.

The divide-by-2 fuse latch circuit of FIG. 3 is for purposes of illustration only. Alternate embodiments may perform the same function of this circuit using different circuit elements. The present invention is not limited to any one circuit to perform this function.

Figure 4:
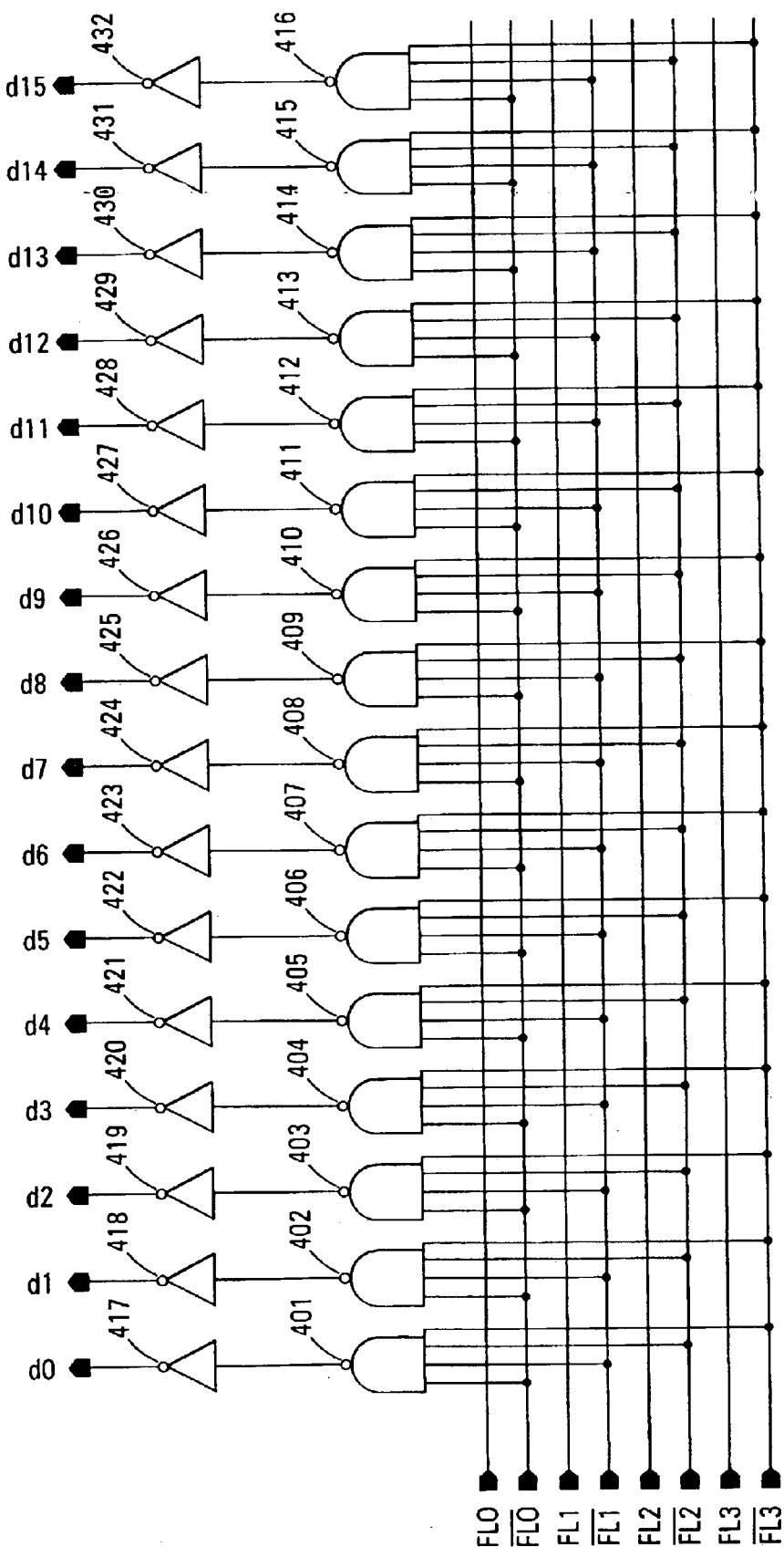
FIG. 4 shows a diagram of a trim fuse decoder circuit in accordance with one embodiment of the present invention.

FIG. 4 illustrates a logic diagram of one embodiment of the fuse decoder 245 of FIG. 2. This circuit 245 is comprised of sixteen NAND gates 401–416 that each has an output coupled to an inverter 417–432, thus forming a logical AND function. The outputs of the inverters 417–432 are the d0–d15 outputs of the fuse decoder 245. This circuit provides a logical high output on one of the d0–d15 lines in response to the binary input on the FL data lines.

As an example of operation of the fuse decoder 245, if the FL data (FL0–FL3 and FL0–FL3*) is received as 1000, the combination of NAND gate 402 and inverter 418 produces a logical high on output d1. Similarly, FL data of 0100 produces a logical high on output d2.

The fuse decoder circuit 245 of FIG. 4 is for purposes of illustration only. The functional equivalent of this circuit may be used that does not require the logic elements or the configuration shown.

Figure 5:
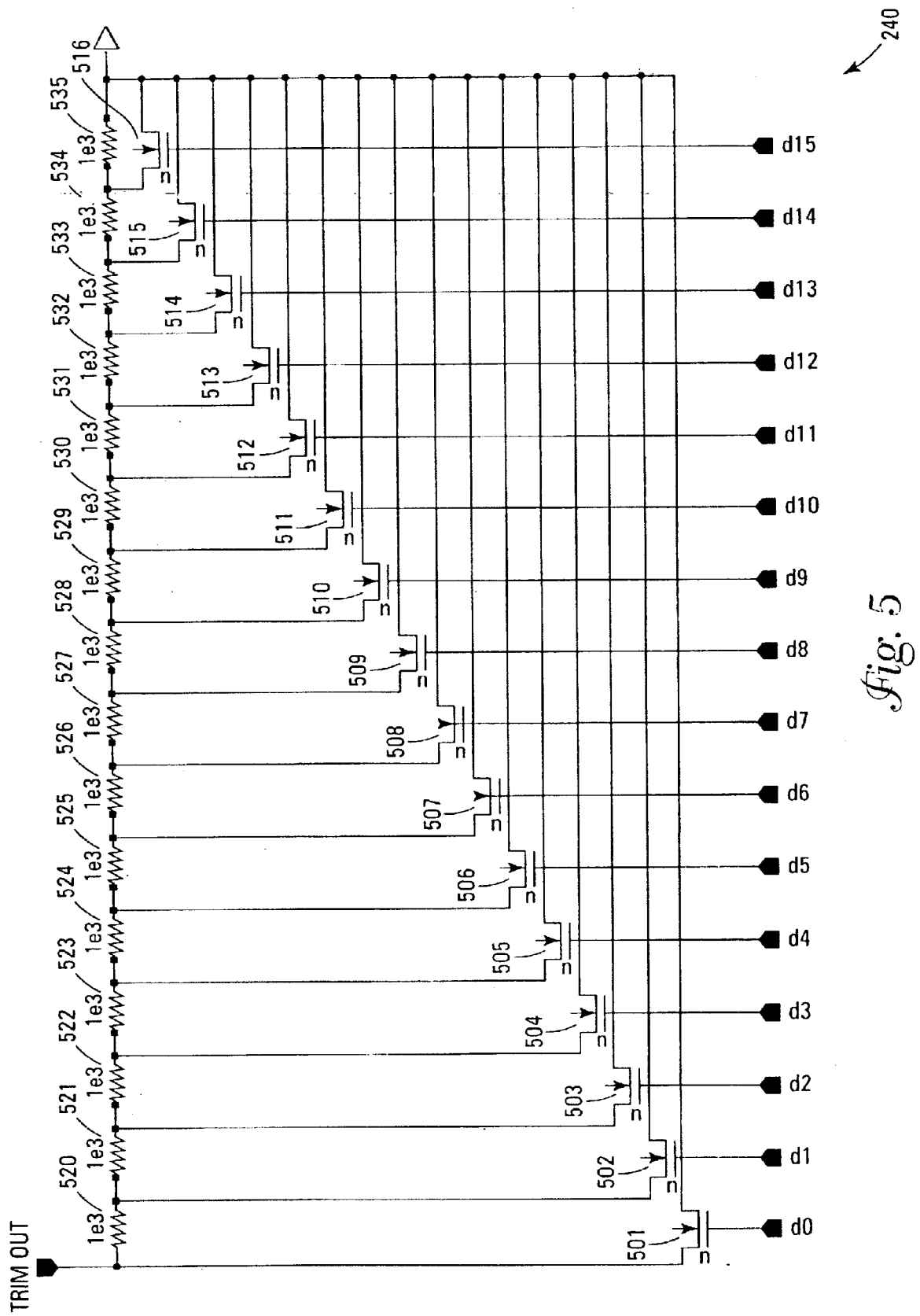
FIG. 5 shows a schematic diagram of a resistive trim circuit in accordance with one embodiment of the present invention.

FIG. 5 illustrates a schematic diagram of the trim circuit 240 of the present invention is illustrated in FIG. 2. This circuit is comprised of sixteen transistors 501–516 each with an associated resistor 520–535 of a series resistor network. The drain of the transistor 501–516 is connected to one side of the associated resistor 520–535 while the source of the transistor is connected to the circuit ground. In one embodiment, the resistors 520–535 are each 1 k Ohm. Alternate embodiments use other resistance values. In still other embodiments, the resistance values are not equal.

The trim circuit operates by receiving a logical high input on one of the d0–d15 lines. This turns on that particular transistor 501–516, thus shorting the node to which it is connected to circuit ground and bypassing any remaining resistors.

For example, if d0 was received as a logical high (or low if the fuse decoder/trim circuit were configured that way), the first transistor 501 would turn on and short the trim output directly to ground. This would give an output on the trim output line close to 0 Ohm since no resistors are connected in series with the trim output and the circuit ground.

If d5 was received as a logical high, the fifth transistor 506 would turn on and short that particular node to ground. This would bypass resistors 525–535 and leave resistors 520–524 as connected in series between the trim output and circuit ground. The total resistance value that would be connected to the trim output would then be the combination of the resistance values for resistors 520–524 or 5 k Ohm in this particular embodiment.

The trim circuit 240 of FIG. 5 is for purposes of illustration only. The functional equivalent of this circuit maybe used that does not require the circuit elements or the configuration shown. In other embodiments the resistors can be replaced by other electronic components such as transistors or diodes.

Figure 6:
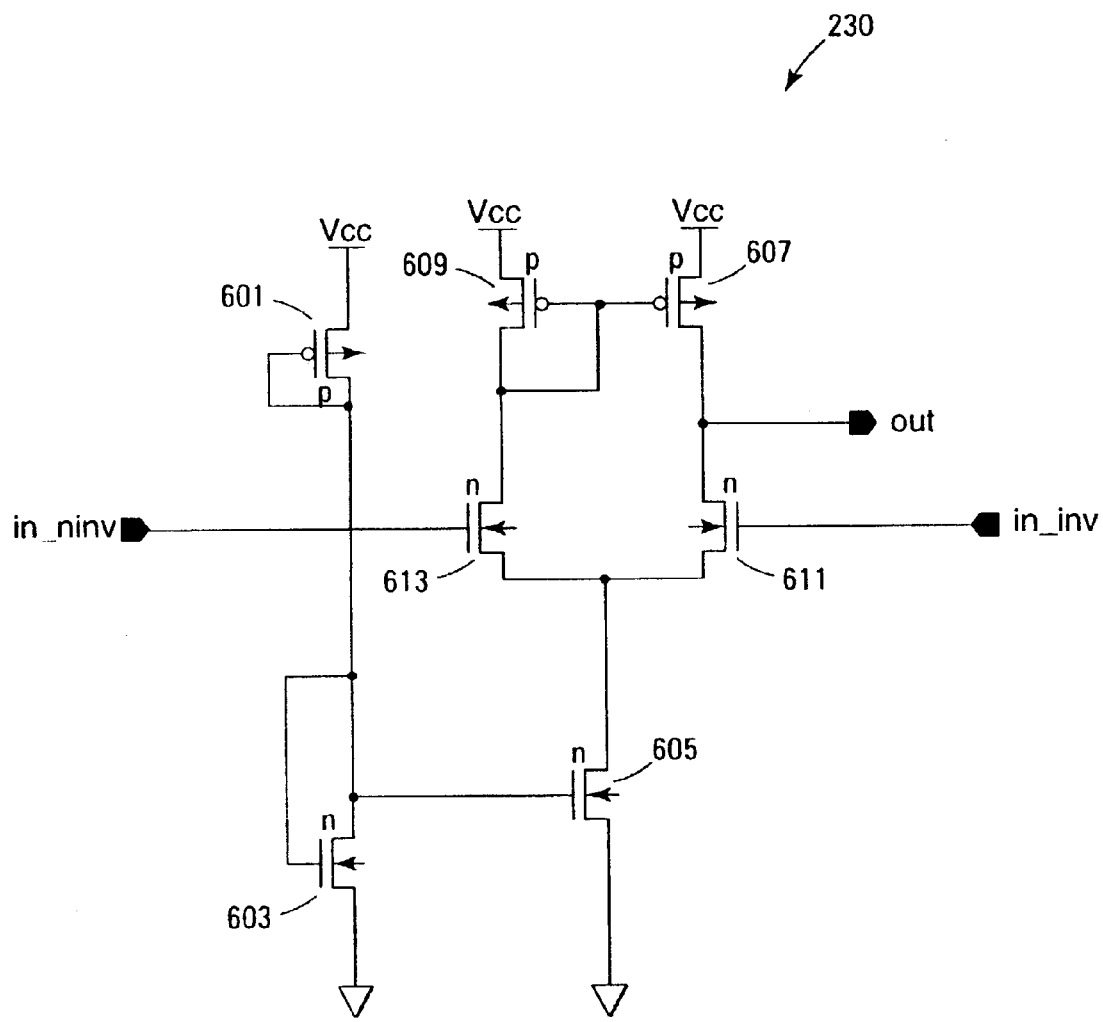
FIG. 6 shows a schematic diagram of a comparator circuit in accordance with one embodiment of the present invention.

FIG. 6 illustrates a schematic diagram of one embodiment for a voltage comparator circuit 230 of FIG. 2. The comparator has two inputs, in$_{13}$ninv and in$_{13}$inv. The in$_{13}$ninv input is connected to the external V$_{ref}$. The internal V$_{ref}$ is connected to the in$_{13}$inv input. Both of these connections are illustrated in FIG. 2.

Two transistors 601, 603 form a voltage divider to bias transistor 605. The biasing value of this transistor 605 is approximately 200 millivolts over the threshold voltage of the transistor 605. Therefore, the current that flows through this transistor 605 is constant and independent of the values of the two inputs of the comparator. This keeps the differential between the two input branches of the comparator at a constant level. In other words, when the current through the branch with transistors 609 and 613 increases, the current through the branch with transistors 607 and 611 decreases.

When the counter circuit of FIG. 2 is initialized, the internal V$_{ref}$ is less than the external V$_{ref}$. Under this condition, the "out" of the comparator is high. After a number of clock cycles, the trim adjustment causes the internal V$_{ref}$ to equal or maybe slightly exceed the external V$_{ref}$. When this occurs, the "out" of the comparator goes from high to low.

The voltage comparator circuit 230 of FIG. 6 is for purposes of illustration only. The functional equivalent of this circuit may be used that does not require the circuit elements or the configuration shown.

Figure 7:
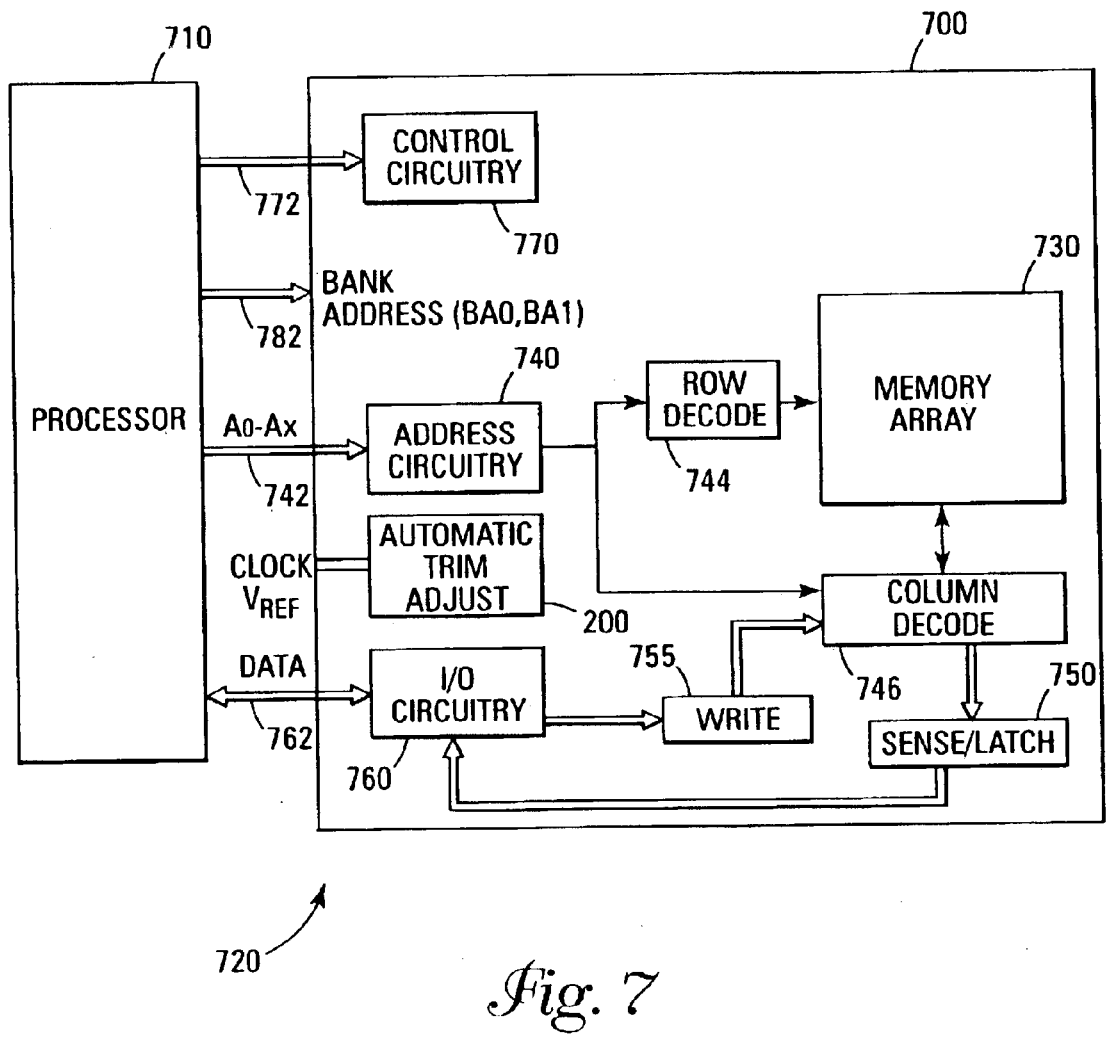
FIG. 7 shows a block diagram of one embodiment of a memory system of the present invention.

FIG. 7 is a functional block diagram of a flash memory device 700 of one embodiment of the present invention that is coupled to a processor 710. The flash memory device 700 and the processor 710 may form part of an electronic system 720. The flash memory device 700 has been simplified to focus on features of the memory that are helpful in understanding the present invention.

The flash memory device includes an array of memory cells 730. The memory cells are non-volatile floating-gate memory cells. The memory array 730 is arranged in banks of rows and columns.

An address buffer circuit 740 is provided to latch address signals provided on address input connections A0–Ax 742. Address signals are received and decoded by a row decoder 744 and a column decoder 746 to access the memory array 730. It will be appreciated by those skilled in the art, with the benefit of the present description, that the number of address input connections depends on the density and architecture of the memory array 730. That is, the number of addresses increases with both increased memory cell counts and increased bank and block counts.

Additional bank address lines 782 are used to access the different banks of the memory array 730. In one embodiment of the present invention, there are four memory banks. In such an embodiment, two bank address lines, BA1 and BA0, are required to activate each memory bank. For example, if memory bank 3 is desired to be activated, from memory banks 0, 1, 2, and 3, then BA1=1 and BA0=1. If a memory embodiment has different quantities of memory banks, different quantities of bank select lines will be required.

The flash memory device 700 reads data in the memory array 730 by sensing voltage or current changes in the memory array columns using sense/latch circuitry 750. The sense/latch circuitry, in one embodiment, is coupled to latch a row of data from the memory array 730. Data input and output buffer circuitry 760 is included for bi-directional data communication over a plurality of data (DQ) connections 762 with the processor 710. Write circuitry 755 is provided to write data to the memory array.

A command control circuit 770 decodes signals provided on control connections 772 from the processor 710. In one embodiment, the control circuit 770 is comprised of a state machine that executes the functions of the memory array 730, including data read, data write, and erase operations. The state machine may also be responsible for executing the functions required for either the virtual synchronous flash memory function or the synchronous flash memory function, depending on the control word.

The reference voltage circuit with automatic trim adjustment 200 of the present invention is connected to an outside V$_{ref}$ connection and clock. The enable signal for the circuit 200 may come from the processor, external test device, or the internal control circuitry 770.

In the embodiment illustrated in FIG. 7, the processor 710 generates the address, data, and control lines to the memory device 700. Alternate embodiments may use other controllers to generate these signals in an electronic system 720. Additionally, the memory device 700 may be coupled to something other than a controller or processor that generates the address, data, and control signals.

The flash memory device illustrated in FIG. 7 has been simplified to facilitate a basic understanding of the features of the memory. A more detailed understanding of internal circuitry and functions of flash memories are known to those skilled in the art.

Figure 8:
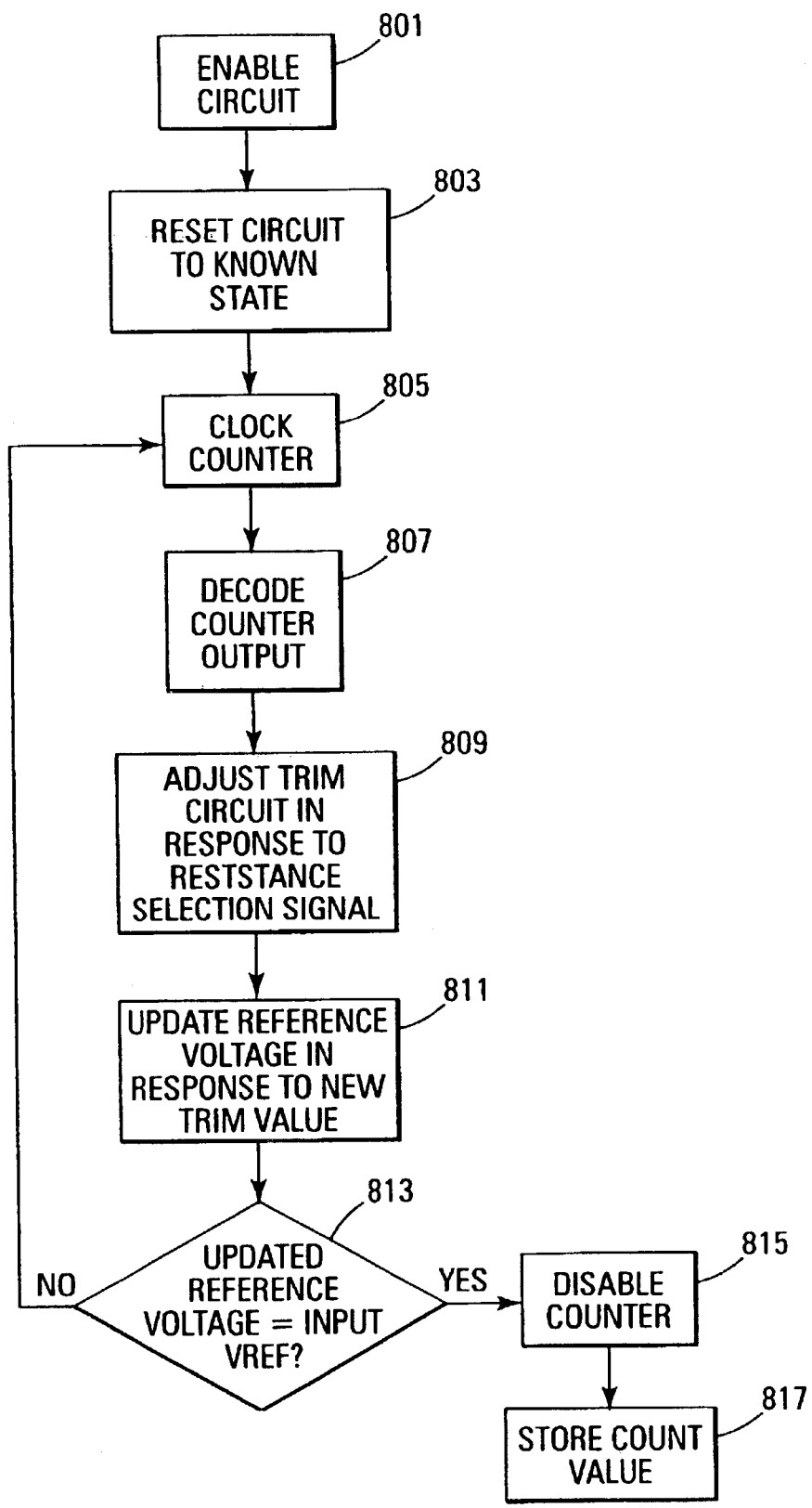
FIG. 8 shows a flowchart of one embodiment of an automatic reference voltage adjustment method of the present invention.

FIG. 8 illustrates a flow chart of one embodiment for a reference voltage adjustment method of the present invention. The circuit is enabled 801 and reset to a known state 803. In one embodiment, the known state is 0000. Alternate embodiments reset the circuit to other states.

The counter circuit is clocked 805 in order to generate the clock count signal that is input to the fuse decoder circuit. The fuse decoder circuit decodes the count 807 and outputs a selection signal to the trim circuit. The trim circuit adjusts the trim resistance in response to the selection signal 809.

In an embodiment where the trim circuit is made up of components other than a resistor network, the selection signal selects the proper components that would cause the trim circuit to generate a voltage selection signal. The voltage selection signal would be used by the reference voltage circuit to generate a different, predetermined internal reference voltage.

The reference voltage circuit uses the new trim resistance to generate an updated reference voltage 811. The updated reference voltage is compared to an external reference voltage to determine if they are substantially equal 813. If the two voltages are equal, the counter is disabled 815 and the count is stored for future use 817. If the voltages are not equal, the counter continues with the next count value 805.

In summary, the embodiments of the present invention provide a quick way to perform V$_{ref}$ trim adjustment by eliminating test operations like data loading into latches and test reads of the intermediate V$_{ref}$ values. The present invention permits different trim adjustments for each die of a wafer in the same parallel testing cycle. The present invention also eliminates the connection to the data bus thus permitting the circuit to be placed on the die independent of the data bus. If the circuit can be placed closer to the V$_{ref}$ source, noise immunity may be improved.

Numerous modifications and variations of the present invention are possible in light of the above teachings. It is therefore to be understood that within the scope of the appended claims, the invention may be practiced otherwise than as specifically described herein.

What is claimed is:

1. A reference voltage adjustment circuit comprising:
   a counter circuit for generating a count signal in response to a clock signal;
   a decoder circuit, coupled to the counter circuit, for decoding the count signal to generate a selection signal;
   a trim circuit, coupled to the decoder circuit, for generating a voltage selection signal in response to the selection signal; and
   a reference voltage circuit, coupled to the trim circuit, for generating an updated reference voltage in response to the voltage selection signal.

2. The reference voltage adjustment circuit of claim 1 and further including:
   a voltage comparator circuit for generating a disable signal when the updated reference voltage is at least substantially equal to an external reference voltage; and
   a count disable circuit for disabling the counter circuit in response to the disable signal.

3. The reference voltage adjustment circuit of claim 2 wherein the count disable circuit comprises a NOR gate coupled to a clock input of the counter circuit, one input of the NOR gate coupled to the disable signal and a second input of the NOR gate coupled to the clock signal.

4. The reference voltage adjustment circuit of claim 1 wherein the trim circuit comprises:
   a plurality of resistors coupled in series; and
   a plurality of transistors that bypass a predetermined number of the plurality of resistors in response to the resistance selection signal.

5. The reference voltage adjustment circuit of claim 2 and further including a plurality of transmission gates that enable the external reference voltage and the clock signal in response to a circuit enable signal.

6. The reference voltage adjustment circuit of claim 5 and further including a reset signal generation circuit, coupled to the counter circuit, for generating a reset signal to set the counter circuit to a known state in response to the circuit enable signal.

7. A reference voltage adjustment circuit having an external reference voltage input and an external clock signal input, the circuit comprising:
   a counter circuit that generates a count signal in response to an external clock signal on the external clock signal input;
   a decoder circuit, coupled to the counter circuit, that decodes the count signal to generate a resistance selection signal;
   a trim circuit, coupled to the decoder circuit, that generates a voltage selection signal at a trim circuit output in response to the selection signal;
   a reference voltage circuit, coupled to the trim circuit, that generates an updated reference voltage in response to the voltage selection signal;
   a comparator circuit coupled to the reference voltage circuit and the external reference voltage input, the comparator circuit generating a count enable/disable signal in response to a comparison between an external reference voltage signal and the updated reference voltage; and
   an enable/disable circuit having a first input coupled to the comparator circuit and a second input coupled to the external clock signal input such that the external clock signal is enabled or disabled in response to a state of the count enable/disable signal.

8. The circuit of claim 7 wherein the voltage selection signal is a resistance value.

9. The circuit of claim 7 wherein the counter circuit comprises a plurality of master/slave flip-flops each coupled to a fuse latch for latching a first data signal and a corresponding first complementary data signal.

10. The circuit of claim 7 wherein the count signal comprises a plurality of data signals and their respective complementary data signals.

11. The circuit of claim 10 wherein the decoder circuit comprises a plurality of AND functions coupled to the plurality of data signals and the respective complementary data signals.

12. The circuit of claim 7 wherein the trim circuit comprises:
   a plurality of resistors coupled in series between the trim circuit output and ground such that a node couples a first resistor to a second resistor; and
   a plurality of transistors coupled to the plurality of resistors wherein each transistor is coupled between a different node and ground such that when a first transistor is in an on state, the node coupled to the first transistor is shorted to ground.

13. The circuit of claim 7 and further including memory that stores the count signal that is responsible for generating the updated reference signal that is substantially equal to the external reference voltage signal.

14. A reference voltage adjustment circuit having an external reference voltage input and an external clock signal input, the circuit comprising:
   a counter circuit that generates a count signal in response to an external clock signal on the external clock signal input;
   a decoder circuit, coupled to the counter circuit, that decodes the count signal to generate a resistance selection signal;
   a trim circuit, coupled to the decoder circuit, that generates a resistance value at a trim circuit output in response to the resistance selection signal;
   a reference voltage circuit, coupled to the trim circuit, that generates an updated reference voltage in response to the resistance value;
   a comparator circuit coupled to the reference voltage circuit and the external reference voltage input, the comparator circuit generating a count enable/disable signal in response to a comparison between an external reference voltage signal and the updated reference voltage; and
   an enable/disable circuit having a first input coupled to the comparator circuit and a second input coupled to the external clock signal input such that the external clock signal is enabled or disable in response to the count enable/disable signal.

15. The circuit of claim 14 and further including:
   a first transmission gate coupled between the external reference voltage input and the comparator circuit, the first transmission gate coupled to a circuit enable input such that a circuit enable signal enables the first transmission gate to allow transmission of the external reference voltage signal; and
   a second transmission gate coupled between the external clock signal input and the enable/disable circuit, the second transmission gate coupled to the circuit enable signal such that the circuit enable signal enables the second transmission gate to allow transmission of the external clock signal.

16. The circuit of claim 14 and further including a plurality of flash fuse elements coupled to the counter circuit to store the count signal that generates the updated reference voltage that is at least substantially equal to the external reference voltage input.

17. A method for generating a reference voltage comprising:
   setting a counter circuit to a known state;
   generating a count signal from the counter circuit in response to a clock signal;
   generating a voltage selection signal in response to the count signal; and
   generating an internal reference voltage in response to the resistance value.

18. The method of claim 17 and further including enabling the clock signal in response to a circuit enable signal.

19. The method of claim 17 wherein the count signal comprises four data bits and their complementary data bits.

20. The method of claim 19 wherein the known state is 0000.

21. A method for generating a reference voltage in a reference voltage adjustment circuit, the method comprising:
   enabling an external clock signal to the circuit with a circuit enable signal;
   enabling an external reference voltage to the circuit with the circuit enable signal;
   setting a counter circuit to a known state in response to the circuit enable signal;
   generating a count signal from the counter circuit in response to the external clock signal;
   generating a resistance value in response to the count signal;
   generating an internal reference voltage in response to the resistance value;
   comparing the internal reference voltage to the external reference voltage; and
   if the internal reference voltage is equal to or greater than the external reference voltage, disabling the counter circuit such that the counter circuit stops at a final count signal that generates the internal reference voltage that is greater than or equal to the external reference voltage.

22. The method of claim 21 and further including storing the final count signal in memory elements.

23. The method of claim 21 wherein generating the resistance value in response to the count signal comprises:
   decoding the count signal;
   selecting a predetermined number of resistors from a plurality of series connected resistors in response to the decoded count signal.

24. A memory device comprising:
   a memory array for storing data;
   a sense amplifier circuit, coupled to the memory array, for determining a programmed state of portions of the memory array;
   a controller circuit that executes memory functions of the memory device; and
   a reference voltage adjustment circuit coupled to the sense amplifier circuit for generating an internal reference voltage, the reference voltage adjustment circuit comprising:
      a counter circuit for generating a count signal in response to a clock signal;
      a decoder circuit, coupled to the counter circuit, for decoding the count signal to generate a selection signal;
      a trim circuit, coupled to the decoder circuit, for generating a voltage selection signal in response to the selection signal; and
      a reference voltage circuit, coupled to the trim circuit, for generating an updated reference voltage in response to the voltage selection signal.

25. An electronic system comprising:
   a processor for generating control signals for the electronic system; and
   a memory device comprising:
      a memory array for storing data;
      a sense amplifier circuit, coupled to the memory array, for determining a programmed state of portions of the memory array;
      a controller circuit that executes memory functions of the memory device; and
      a reference voltage adjustment circuit coupled to the sense amplifier circuit for generating an internal reference voltage, the reference voltage adjustment circuit comprising:
         a counter circuit for generating a count signal in response to a clock signal;
         a decoder circuit, coupled to the counter circuit, for decoding the count signal to generate a selection signal;
         a trim circuit, coupled to the decoder circuit, for generating a voltage selection signal in response to the selection signal; and
         a reference voltage circuit, coupled to the trim circuit, for generating an updated reference voltage in response to the voltage selection signal.

* * * * *

UNITED STATES PATENT AND TRADEMARK OFFICE
CERTIFICATE OF CORRECTION

PATENT NO. : 6,738,298 B1
DATED : May 18, 2004
INVENTOR(S) : Cioaca

It is certified that error appears in the above-identified patent and that said Letters Patent is hereby corrected as shown below:

Column 7,
Line 7, replace "$in_{13}ninv$" with -- in_ninv -- and "$in_{13}inv$" with -- in_inv --
Line 9, replace "$in_{13}inv$" with -- in_inv --

Signed and Sealed this

Thirtieth Day of November, 2004

JON W. DUDAS
*Director of the United States Patent and Trademark Office*